United States Patent
Lin et al.

(10) Patent No.: US 11,195,945 B2
(45) Date of Patent: Dec. 7, 2021

(54) CAP STRUCTURE COUPLED TO SOURCE TO REDUCE SATURATION CURRENT IN HEMT DEVICE

(71) Applicant: Taiwan Semiconductor Manufacturing Co., Ltd., Hsin-Chu (TW)

(72) Inventors: Ming-Cheng Lin, Yilan (TW); Chen-Bau Wu, Zhubei (TW); Chun Lin Tsai, Hsin-Chu (TW); Haw-Yun Wu, Hsin-Chu (TW); Liang-Yu Su, Yunlin County (TW); Yun-Hsiang Wang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 14 days.

(21) Appl. No.: 16/558,518

(22) Filed: Sep. 3, 2019

(65) Prior Publication Data
US 2021/0066483 A1 Mar. 4, 2021

(51) Int. Cl.
*H01L 29/778* (2006.01)
*H01L 21/285* (2006.01)
(Continued)

(52) U.S. Cl.
CPC .... *H01L 29/7786* (2013.01); *H01L 21/28581* (2013.01); *H01L 29/2003* (2013.01);
(Continued)

(58) Field of Classification Search
CPC ............... H01L 29/7786; H01L 29/205; H01L 29/66462; H01L 21/28581; H01L 29/2003;
(Continued)

(56) References Cited

U.S. PATENT DOCUMENTS 6,133,593 A * 10/2000 Boos .................. H01L 29/1029
257/194
6,521,961 B1 * 2/2003 Costa ................ H01L 21/28587
257/402

(Continued)

OTHER PUBLICATIONS

Techspaceofatul. "18 AlGAN-GaN HEMTs." The date of publication is unknown. Retrieved online on Apr. 2, 2019 from https://www.scribd.com/document/200365391/18-Algan-gan-Hemts.

(Continued)

*Primary Examiner* — Shahed Ahmed
*Assistant Examiner* — Khatib A Rahman
(74) *Attorney, Agent, or Firm* — Eschweiler & Potashnik, LLC

(57) ABSTRACT

In some embodiments, the present disclosure relates to a high voltage device that includes a substrate comprising a first semiconductor material. A channel layer that comprises a second semiconductor material is arranged over the substrate. An active layer that comprises a third semiconductor material is arranged over the channel layer. Over the active layer is a source contact spaced apart from a drain contact. A gate structure is arranged laterally between the source and drain contacts and over the active layer to define a high electron mobility transistor (HEMT) device. Between the gate structure and the source contact is a cap structure, which is coupled to the source contact and laterally spaced from the gate structure. The cap structure and a gate electrode of the gate structure comprise a same material.

20 Claims, 13 Drawing Sheets

(51) Int. Cl.
*H01L 29/20* (2006.01)
*H01L 29/205* (2006.01)
*H01L 29/66* (2006.01)
*H01L 29/47* (2006.01)
*H01L 29/417* (2006.01)

(52) U.S. Cl.
CPC ...... *H01L 29/205* (2013.01); *H01L 29/41758* (2013.01); *H01L 29/475* (2013.01); *H01L 29/66462* (2013.01)

(58) Field of Classification Search
CPC ............. H01L 29/475; H01L 29/41758; H01L 29/1066; H01L 29/41725; H01L 29/0619; H01L 29/778; H01L 29/0684; H01L 29/0607
See application file for complete search history.

(56) References Cited

U.S. PATENT DOCUMENTS

| | | | | |
|---|---|---|---|---|
| 8,344,421 B2* | 1/2013 | Gao | ............ | H01L 29/7786 257/192 |
| 9,293,573 B2* | 3/2016 | Akutsu | ............ | H01L 29/7786 |
| 9,431,527 B1* | 8/2016 | Luo | ............ | H01L 29/4236 |
| 9,443,737 B2* | 9/2016 | Kondo | ............ | H01L 29/66462 |
| 9,601,608 B2* | 3/2017 | Tsai | ............ | H01L 29/66462 |
| 10,177,239 B2* | 1/2019 | Morancho | ............ | H01L 29/1075 |
| 2007/0228416 A1* | 10/2007 | Chen | ............ | H01L 29/7787 257/192 |
| 2009/0004881 A1* | 1/2009 | Chen | ............ | H01L 29/513 438/763 |
| 2010/0019279 A1* | 1/2010 | Chen | ............ | H01L 27/0605 257/194 |
| 2011/0018002 A1 | 1/2011 | Chen et al. | | |
| 2012/0193637 A1* | 8/2012 | Kalnitsky | ............ | H01L 21/0262 257/76 |
| 2013/0256679 A1* | 10/2013 | Yao | ............ | H01L 29/66462 257/76 |
| 2013/0256686 A1* | 10/2013 | Kanamura | ............ | H01L 29/7787 257/76 |
| 2016/0047781 A1* | 2/2016 | Koley | ............ | B81C 1/0015 73/643 |
| 2016/0087090 A1* | 3/2016 | Hsu | ............ | H01L 29/66462 257/76 |
| 2016/0276473 A1* | 9/2016 | Edwards | ............ | H01L 29/7786 |
| 2018/0254371 A1* | 9/2018 | Zhang | ............ | H01L 27/14643 |

OTHER PUBLICATIONS

Wikipedia.org "Aluminium Gallium Nitride." Published on Oct. 19, 2018.
Wikipedia.org "Gallium Nitride." Published on Mar. 31, 2019.
Electronics Notes. "HEMT, High Electron Mobility Transistor." The date of publication is unknown. Retrieved online Mar. 19, 2019 from https://www.electronics-notes.com/articles/electronic_components/fet-field-effect-transistor/hemt-high-electron-mobility-transistor-phemt.php.
Wikipedia.org. "High-Electron-Mobility Transistor." Published on Jan. 2, 2019.
University of the Philippines Los Baños. "MM5017 Electronic Materials Devices and Fabrication—Lecture 9: Metal-Semiconductor Junctions." The date of publication is unknown. Retrieved online on Apr. 16, 2019 from https://www.coursehero.com/file/pibujp/MM5017-Electronic-materials-devices-and-fabrication-Figure-14-Current-flow/.
Wikipedia.org "Ohmic Contact." Published on Feb. 20, 2019.
Wikipedia.org "Titanium Nitride." Published on Feb. 24, 2019.

* cited by examiner

CAP STRUCTURE COUPLED TO SOURCE TO REDUCE SATURATION CURRENT IN HEMT DEVICE

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies. High electron mobility transistor (HEMT) devices are one promising candidate for high voltage transistor devices that operate at high frequencies with fast switching speeds and low noise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
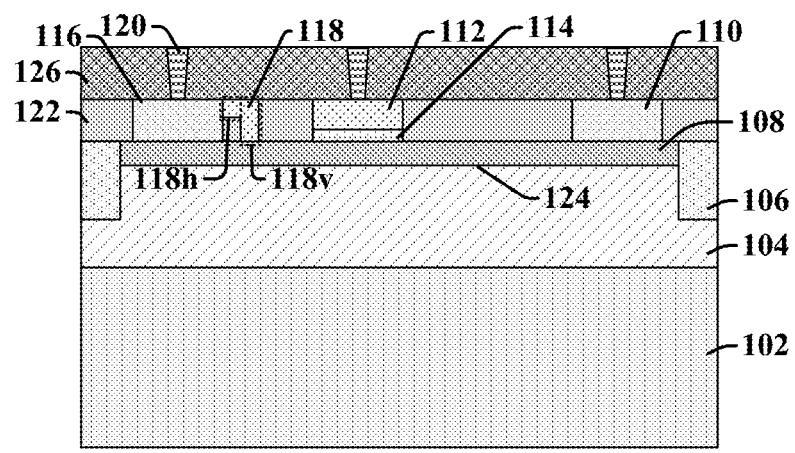
FIGS. 1A, 1B and 1C illustrate a cross-sectional view, a top-view and a perspective view of some embodiments of a high electron mobility transistor (HEMT) device comprising a cap structure that continuously extends along a length of a source contact.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high electron mobility transistor (HEMT) device includes a heterojunction which is at an interface between two materials having different band gaps and which acts as a channel region of the HEMT. For example, the heterojunction is disposed over a semiconductor substrate and can be disposed between a gallium nitride layer and an aluminum gallium nitride layer. Further, a gate electrode is arranged over the heterojunction and between a source contact and a drain contact to control current flow between the source and drain contacts of the HEMT.

During operation of the HEMT device, when a suitable voltage bias is applied across the gate electrode and the source and drain contacts, a current flows along the heterojunction. The applied voltage bias controls if the HEMT device operates in an enhancement mode or a depletion mode. In the enhancement mode, the HEMT device uses a gate to source voltage to switch the HEMT device "ON" (e.g., to "turn on" current between source and drain). Thus, in enhancement mode, the HEMT device is a "normally open" switch in some regards. In depletion mode, the HEMT device uses a gate to source voltage to switch the device "OFF" (e.g., to "turn off" current between source and drain). Thus, in depletion mode, the HEMT device is a "normally closed" switch in some regards.

In the enhancement mode, the current at the heterojunction eventually reaches a saturation current which is the maximum current that can flow along the heterojunction before breakdown. In high voltage applications, in the enhancement mode, the saturation current may become too large, which, in some embodiments, may cause device failure by, for example, local heating in the HEMT device.

The present disclosure, in some embodiments, relates to a cap structure on a HEMT device that directly contacts the source contact and that comprises a same material as the gate electrode. The cap structure is arranged laterally between the gate electrode and the source contact and is spaced from the gate electrode. The cap structure is biased according to the source contact and puts the channel region into a partially depleted mode. Thus, when the HEMT device is in the enhancement mode, the cap structure partially depletes the channel region (e.g., partially "turns off" current between source and drain) and the saturation current is reduced. As a result, during high voltage applications, the HEMT device with the cap structure has a reduced saturation current and device failure is mitigated.

FIG. 1A illustrates a cross-sectional view 100A of some embodiments of a HEMT device comprising a cap structure coupled to a source contact.

The HEMT device includes a channel layer 104 over a substrate 102. An active layer 108 is arranged over the channel layer 104. The active layer 108 and the channel layer 104 meet at an interface known as a heterojunction 124 that is substantially parallel or co-planar to a top surface of the substrate 102. In some embodiments, the channel layer 104 comprises a binary III/V semiconductor (e.g., a first III-nitride material like gallium nitride or gallium arsenide)

and the active layer 108 comprises a ternary III/V semiconductor (e.g., a second III-nitride material like aluminum gallium nitride or aluminum gallium arsenide). In some embodiments, an isolation structure 106 surrounds outer sidewalls of the active layer 108 and upper portions of the channel layer 104. A source contact 116 and a drain contact 110 are arranged over the active layer 108. In some embodiments, the source contact 116 and the drain contact 110 directly contact the active layer 108. The source contact 116 and the drain contact 110 are laterally spaced apart from one another. Laterally between the source contact 116 and the drain contact 110 is a gate electrode 112 over a gate barrier layer 114. In some embodiments, the drain contact 110, the source contact 116, and the gate electrode 112 are spaced apart from one another by a passivation layer 122. In other embodiments, the drain contact 110, the source contact 116, and the gate electrode 112 are spaced apart from one another by a passivation layer 122 and also a dielectric structure 126. Contact vias 120 that are embedded in the dielectric structure 126 are coupled to the drain contact 110, the source contact 116, and the gate electrode 112.

In some embodiments, a cap structure 118 is arranged over the active layer 108 and coupled to the source contact 116. In some embodiments, the cap structure 118 comprises a horizontally extending portion 118h and a vertically extending portion 118v. The horizontal direction may be parallel to an upper surface of the substrate 102, whereas the vertical direction may be normal to the upper surface of the substrate 102 and thus, perpendicular to the horizontal direction. The horizontally extending portion 118h of the cap structure 118 directly contacts a sidewall of the source contact 116. The horizontally extending portion 118h, in some embodiments, is spaced apart from the active layer 108 by the passivation layer 122. In some embodiments, at least a lower region of the vertically extending portion 118v of the cap structure 118 is spaced apart from the source contact 116 by the passivation layer 122. In some embodiments, an upper region of the vertically extending portion 118v of the cap structure 118 contacts the horizontally extending portion 118h of the cap structure 118. In some embodiments, a lower surface of the vertically extending portion 118v directly contacts the active layer 108. Thus, in some embodiments, the cap structure 118 resembles an "L" shape. In such embodiments, the cap structure 118 may resemble the "L" shape due to manufacturing techniques (see, method in FIGS. 3-17).

The cap structure 118 comprises a same material as the gate electrode 112. For example, in some embodiments, the cap structure 118 and the gate electrode 112 may comprise titanium nitride, nickel, tungsten, titanium, or platinum. The cap structure 118 and the gate electrode 112 comprise a different material than the source contact 116. For example, in some embodiments, the source contact 116 may comprise titanium or aluminum. In some embodiments, the cap structure 118 comprises a first material that has a higher work function than the active layer 108 such that the cap structure 118 is coupled to the active layer 108 as a Schottky contact, whereas the source contact 116 comprises a second material different from the first material that has a lower work function than the active layer 108 such that the source contact 116 is coupled to the active layer 108 as an Ohmic contact. The cap structure 118 is electrically coupled to the source contact 116 to receive a same voltage bias that the source contact 116 receives. By being coupled to the source contact 116 and by acting as a Schottky contact, the cap structure 118 partially depletes the channel region along the heterojunction 124 and thus, reduces the saturation current of the HEMT device when in the enhancement mode (e.g., when the HEMT device is "ON"). As a result, the cap structure 118 increases the reliability of the HEMT device when operating at high voltages.

Figure 1B:
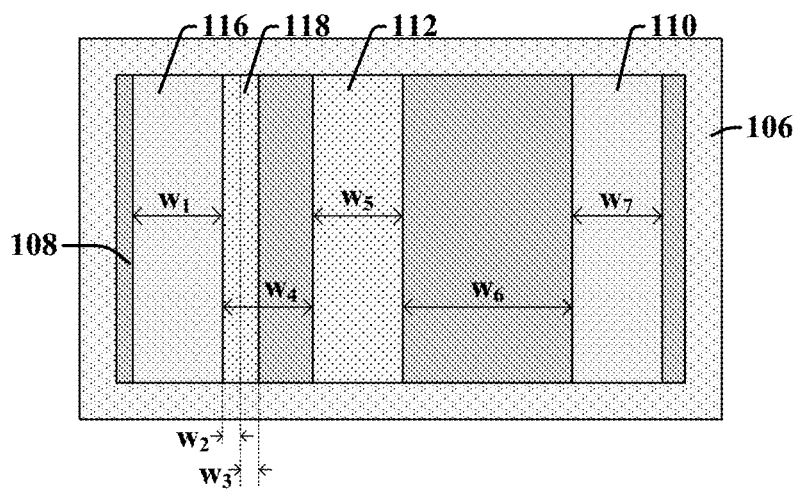

FIG. 1B illustrates a top-view 100B of some embodiments of a HEMT device comprising a cap structure coupled to a source contact.

In some embodiments, the top-view 100B of FIG. 1B corresponds to the cross-sectional view 100A of FIG. 1A, except that the passivation layer 122, the dielectric structure 126, and the contact vias 120 are not illustrated in the top-view 100B. In some embodiments, the isolation structure 106 is continuously connected in a rectangular, ring-like shape and completely surrounds the active layer 108. In some embodiments, the source contact 116 is spaced from the gate electrode 112 by a fourth width $w_4$ and the drain contact 110 is spaced from the gate electrode 112 by a sixth width $w_6$. In some embodiments, the sixth width $w_6$ is greater than the fourth width $w_4$. For example, in some embodiments, the fourth width $w_4$ may be in range of between approximately 1.1 micrometers and approximately 2 micrometers. For example, in some embodiments, the sixth width $w_6$ is greater than the fourth width $w_4$. In some embodiments, the sixth width $w_6$ may be equal to approximately 23 micrometers. The source contact 116 has a first width $w_1$ that is substantially uniform along its length. The drain contact 110 has a seventh width $w_7$ that is substantially uniform along its length. In some embodiments, the first width $w_1$ and the seventh width $w_7$ are the same. For example, in some embodiments, the first width $w_1$ and the seventh width $w_7$ may each be equal to approximately 1 micrometer. Also, in some embodiments, the source contact 116 and the drain contact 110 comprise a same, conductive material. The gate electrode 112 has a fifth width $w_5$ that is substantially uniform along its length. In some embodiments, the fifth width $w_5$ is greater than the first width $w_1$ and the seventh width $w_7$. For example, in some embodiments, the fifth width $w_5$ may be equal to approximately 1.4 micrometers.

The cap structure 118 has a second width $w_2$ that corresponds to the width of the horizontally extending portion 118h of the cap structure 118 and a third width $w_3$ that corresponds to the vertically extending portion 118v of the cap structure 118. The sum of the second and third widths, $w_2+w_3$, indicates the width of the cap structure 118 from the top-view 100B perspective and is the maximum width of the cap structure 118, whereas, the third width $w_3$ indicates a minimum width of the cap structure 118. In some embodiments, the second width $w_2$ and the third width $w_3$ may be the same. In other embodiments, the second width $w_2$ may be less than or greater than the third width $w_3$. In some embodiments, the sum of the second and third widths, $w_2+w_3$, may be in a range of between approximately 0.1 micrometers and approximately 1 micrometer. In other embodiments, the minimum value of third width $w_3$ and the minimum value of the second width $w_2$ may each be at least, for example, approximately 0.5 micrometers. Thus, the cap structure 118 may add up to 1 micrometer to the total width ($w_1+w_4+w_5+w_6+w_7$) of the HEMT device. In some embodiments, the total width ($w_1+w_4+w_5-Fw_6+w_7$) of the HEMT device may be in a range of between approximately 27.5 micrometers and approximately 28.4 micrometers. The second and/or third widths $w_2$, $w_3$ may be extended to adjust the desired saturation current of the HEMT device.

Figure 1C:
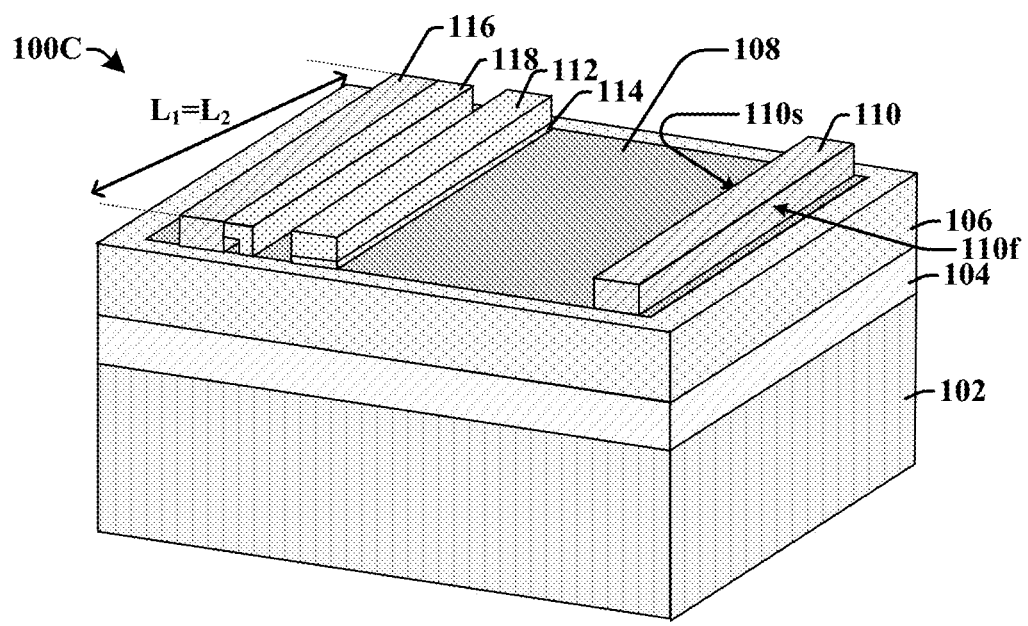

FIG. 1C illustrates a perspective view 100C of some embodiments of a HEMT device comprising a cap structure coupled to a source contact.

In some embodiments, the perspective view 100C of FIG. 1C corresponds to the cross-sectional view 100A of FIG. 1A, except that the passivation layer 122, the dielectric structure 126, and the contact vias 120 are not illustrated in the perspective view 100C. The perspective view 100C may also correspond to the top-view 100B of FIG. 1B. In some embodiments, the source contact 116, the drain contact 110 and the gate electrode 112 are spaced from the isolation structure 106. For example, in some embodiments, a first sidewall 110f of the drain contact 110 and a second sidewall 110s of the drain contact 110 may directly overlie the active layer 108. In other embodiments (not shown), at least some portions of the source contact 116 and/or the drain contact 110 directly overlie at least some portions of the isolation structure 106. For example, in such other embodiments, the first sidewall 110f of the drain contact 110 may directly overlie the isolation structure 106, and the second sidewall 110s of the drain contact 110 may directly overlie the active layer 108. Further, in some embodiments, a top surface of the isolation structure 106 is substantially co-planar with a top surface of the active layer 108. In some embodiments, the cap structure 118 has a top surface that is substantially co-planar with a top surface of the source contact 116. The source contact 116 has a first length $L_1$, and the cap structure 118 has a second length $L_2$, wherein the first and second lengths $L_1$, $L_2$ are measured in a direction that is perpendicular to the measurement direction of the widths illustrated in FIG. 1B. In some embodiments, the cap structure 118 continuously extends along the first length $L_1$ of the source contact 116, such that the first length $L_1$ and the second length $L_2$ are equal.

In some embodiments, the cap structure 118 may reduce the saturation current by more than 50 percent when the HEMT device is in enhancement mode. For example, in some embodiments, when the cap structure 118 is present, when the voltage bias across the source contact 116 and the drain contact 110 is equal to 6 volts and when a voltage bias applied to the drain contact 110 is equal to 20 volts, the saturation current of the HEMT device is approximately 2 amperes. In contrast, if the same aforementioned conditions are applied to the source contact 116, the drain contact 110, and the gate electrode 112, but the cap structure 118 is not present, the saturation current of the HEMT device is approximately 5 amperes. Thus, in this example, the presence of the cap structure 118 reduces the saturation current of the HEMT device by 60 percent. Further, in some embodiments, under high voltage applications, when the cap structure 118 is present, the HEMT device can withstand a voltage bias applied to the drain contact 110 of up to 450 volts without breakdown. In contrast, in other embodiments where the cap structure 118 is not present, the HEMT device can only withstand a voltage bias applied to the drain contact 110 of up to 300 volts without breakdown. Thus, the presence of the cap structure 118 greatly reduces the saturation current of a HEMT device to allow for high voltage applications without device failure.

Figure 2A:
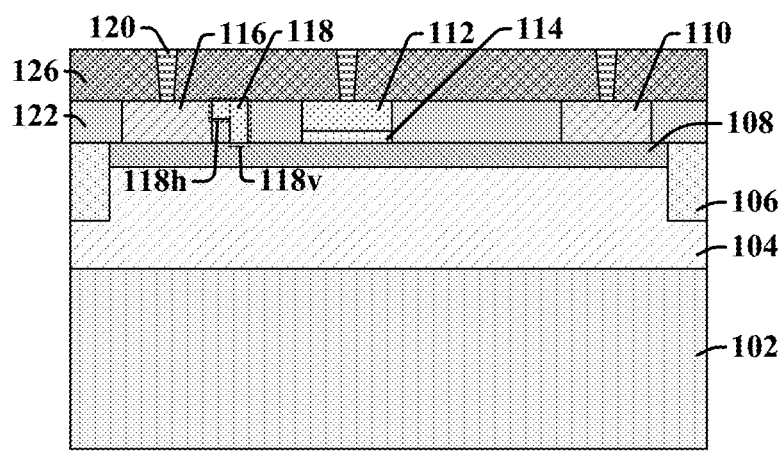
FIGS. 2A, 2B and 2C illustrate a cross-sectional view, a top-view and a perspective view of some embodiments of a HEMT device comprising a cap structure that has multiple cap segments spaced apart from one another and extending along a length of a source contact.

FIG. 2A illustrates a cross-sectional view 200A of some alternative embodiments of a HEMT device comprising a cap structure coupled to a source contact.

The cross-sectional view 200A of FIG. 2A comprises the same elements as the cross-sectional view 100A of FIG. 1A. However, the cross-sectional view 200A of FIG. 2A, although identical to the cross-sectional view 100A of FIG. 1A, may correspond to a cap structure 118 with different features.

Figure 2B:
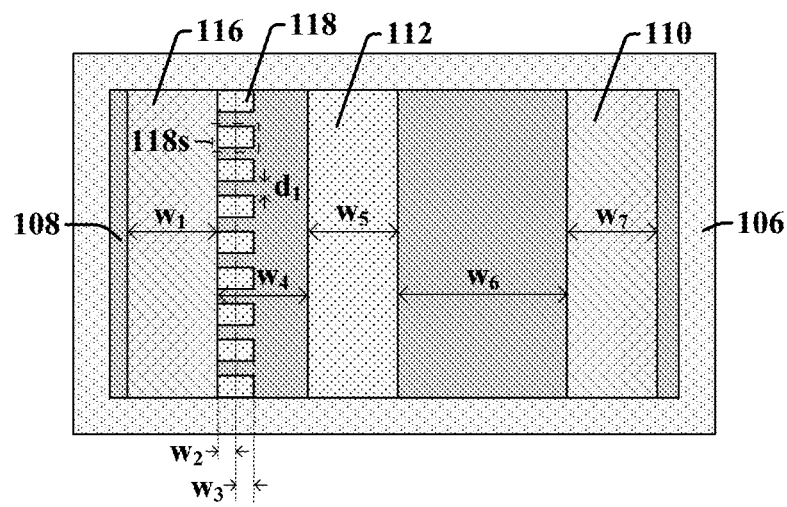

FIG. 2B illustrates a top-view 200B of some alternative embodiments of a HEMT device comprising a cap structure coupled to a source contact.

In some embodiments, the top-view 200B of FIG. 2B corresponds to the cross-sectional view 200A of FIG. 2A, except that the passivation layer 122, the dielectric structure 126, and the contact vias 120 are not illustrated in the top-view 100B. The top-view 200B of FIG. 2B comprises the same features as the top-view 100B of FIG. 1B, except that the cap structure 118 comprises multiple cap segments 118s. Each cap segment 118s is spaced from a nearest neighbor by a first distance $d_1$. In some embodiments, the minimum value of the first distance $d_1$ may be, for example, approximately 0.5 micrometers. In some embodiments, from the top-view 200B perspective, the multiple cap segments 118s of the cap structure 118 cover approximately 5% to approximately 10% less of a region of the active layer 108 compared to the cap structure 118 of FIG. 1B that continuously extends along the length of the source contact 116 and covers 100% of the region of the active layer 108. In some embodiments, the second width $w_2$, the third width $w_3$, and/or the first distance $d_1$ of the cap structure 118 with multiple cap segments 118s may be increased or decreased to adjust the desired saturation current of the HEMT device, which provides more flexibility in designing a reliable HEMT device compared to the cap structure 118 that continuously extends along the length of the source contact 116 in FIG. 1B.

Figure 2C:
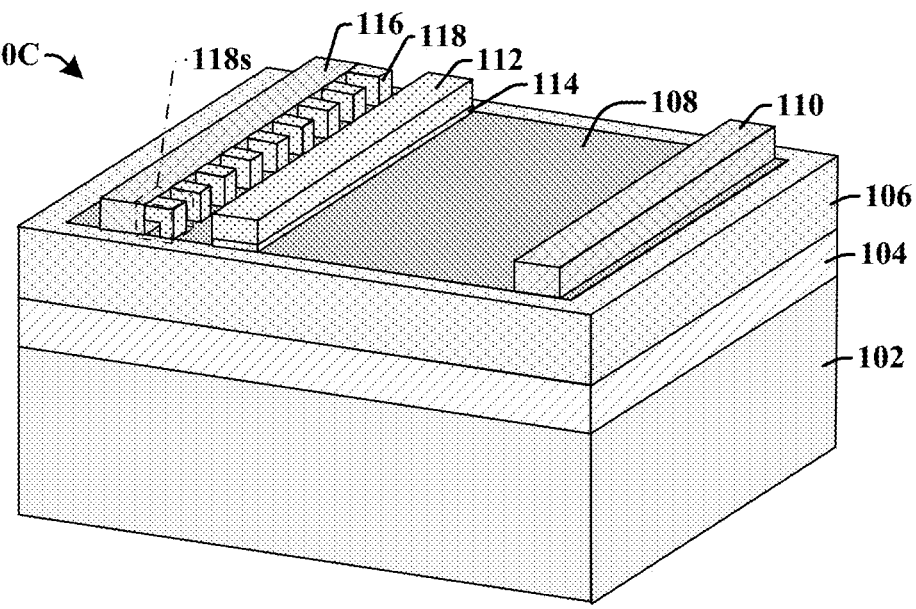

FIG. 2C illustrates a perspective view 200C of some embodiments of a HEMT device comprising a cap structure coupled to a source contact.

In some embodiments, the perspective view 200C of FIG. 2C corresponds to the cross-sectional view 200A of FIG. 2A, except that the passivation layer 122, the dielectric structure 126, and the contact vias 120 are not illustrated in the perspective view 200C. The perspective view 200C may also correspond to the top-view 200B of FIG. 2B. In the perspective view 200C, the cap structure 118 comprises 9 cap segments 118s. It will be appreciated that the cap structure 118 may comprise any number of cap segments 118s, and that the 9 cap segments 118s in FIG. 3C is arbitrary. In some embodiments, top surfaces of the cap segments 118s are substantially co-planar with a top surface of the source contact 116. Each cap segment 118s directly contacts and is electrically coupled to the source contact 116. Thus, each cap segment 118s receives the same voltage bias as the source contact 116 through the contact via (120 of FIG. 2A) that is coupled to the source contact 116.

FIGS. 3-17 illustrate cross-sectional views 300-1700 of some embodiments of a method of forming a HEMT device comprising a cap structure coupled to a source contact. Although FIGS. 3-17 are described in relation to a method, it will be appreciated that the structures disclosed in FIGS. 3-17 are not limited to such a method, but instead may stand alone as structures independent of the method.

Figure 3:
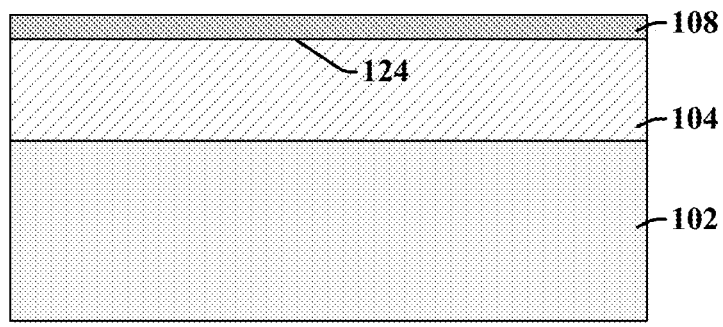
FIGS. 3-17 illustrate cross-sectional views of some embodiments of a method of forming a HEMT device having a cap structure contacting a source contact.

As shown in the cross-sectional view 300 of FIG. 3, a substrate 102 comprising a first semiconductor material having a first doping type (e.g., p-type or n-type) is provided. In some embodiments, the substrate 102 comprises p-type silicon, which is a widely available substrate and therefore reduces cost of the HEMT device. A channel layer 104 is deposited over the substrate 102. The channel layer 104 comprises a second semiconductor material that is different than the first semiconductor material. An active layer 108 comprising a third semiconductor material is deposited over the channel layer 104. In some embodiments, the channel layer 104 comprises a binary III/V semiconductor whereas the active layer 108 comprises a ternary III/V semiconductor. For example, in some embodiments, the channel layer 104 may comprise gallium nitride (GaN) and the active layer 108 may comprise aluminum gallium nitride (AlGaN). In other embodiments, the channel layer 104 may comprise gallium arsenide (GaAs) and the active layer 108 may comprise aluminum gallium arsenide (AlGaAs). In some embodiments, the channel layer 104 and/or the active layer 108 may be formed over the substrate 102 by a deposition process (e.g., chemical vapor deposition (CVD), plasma enhanced chemical vapor deposition (PE-CVD), atomic layer deposition (ALD), physical vapor deposition (PVD), etc.). In some embodiments, an isolation structure (106 of FIG. 1A) may be formed to surround the active layer 108 and partially surround the channel layer 104. At an interface between the active layer 108 and the channel layer 104 is a heterojunction 124, which may act as a channel region when a voltage bias is present. The heterojunction 124 may be present because, in part, the second semiconductor material of the channel layer 104 has a different band gap than the third semiconductor material of the active layer 108. For example, aluminum gallium nitride (AlGaN) has a larger band gap than gallium nitride (GaN).

Figure 4:
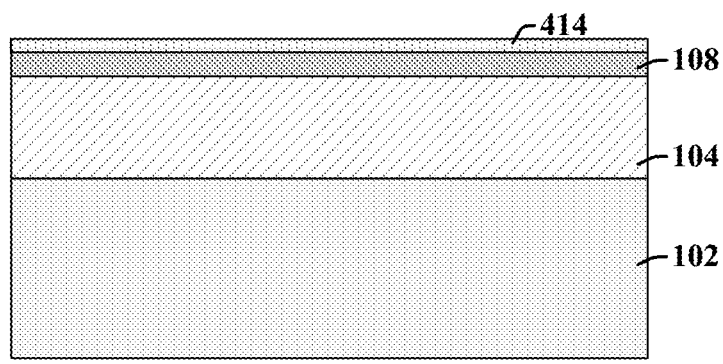

As shown in the cross-sectional view 400 of FIG. 4, in some embodiments, a barrier material 414 may be deposited over the active layer 108. The barrier material 414, in some embodiments, may comprise the second semiconductor material having a second doping type (e.g., p-type). For example, in some embodiments, the barrier material 414 may comprise p-doped gallium nitride (p-GaN). In other embodiments, the barrier material 414 may comprise a dielectric material (e.g., an oxide, a nitride, or the like). Thus, like the channel layer 104, the barrier material 414 may be formed over the active layer 108 by a deposition process (e.g., chemical vapor deposition (CVD), plasma enhanced chemical vapor deposition (PE-CVD), atomic layer deposition (ALD), physical vapor deposition (PVD), etc.).

Figure 5:
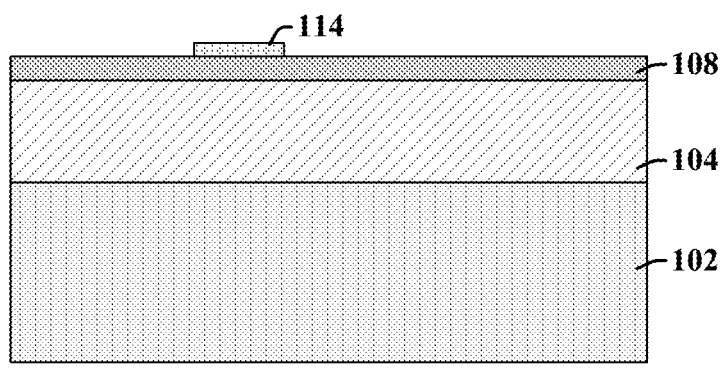

As shown in the cross-sectional view 500 of FIG. 5, the barrier material 414 of FIG. 4 may be patterned to form a gate barrier layer 114. The gate barrier layer 114 may be formed by photolithography and etching steps. The gate barrier layer 114 is formed on an area of the active layer 108 that is meant for a gate electrode.

Figure 6:
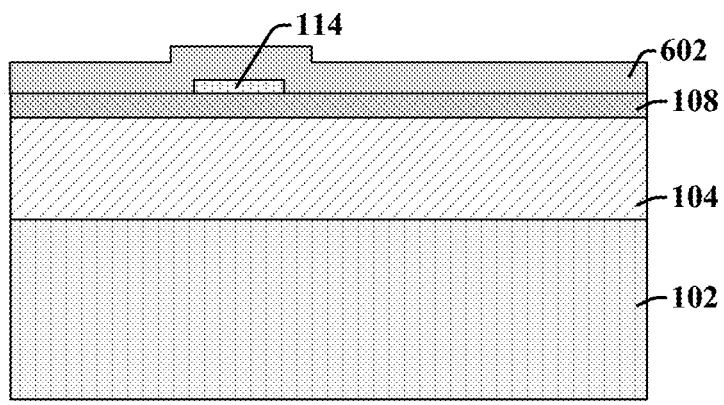

As shown in the cross-sectional view 600 of FIG. 6, a conformal passivation layer 602 is deposited over the active layer 108. The conformal passivation layer 602 may comprise, in some embodiments a nitride or an oxide, such as, for example, silicon nitride, silicon oxynitride, silicon oxide, or the like.

Figure 7:
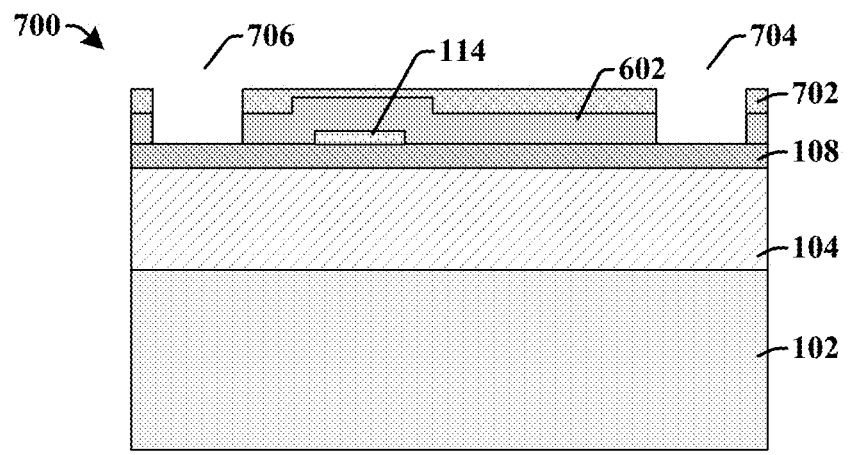

As shown in the cross-sectional view 700 of FIG. 7, a source/drain mask 702 is formed over the conformal passivation layer 602. Using photolithography and an etch (e.g., a dry etch) that is selective to the conformal passivation layer 602 and the source/drain mask 702, the source/drain mask 702 and the conformal passivation layer 602 are patterned to define a source cavity 706 and a drain cavity 704. The source cavity 706 and the drain cavity 704 have bottom surfaces defined by the active layer 108.

Figure 8:
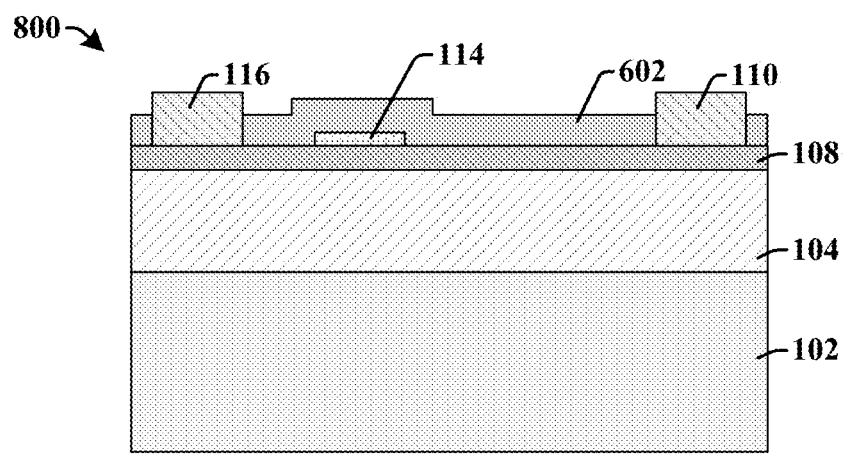

As shown in the cross-sectional view 800 of FIG. 8, a source contact 116 and a drain contact 110 are formed within the source cavity (706 of FIG. 7) and the drain cavity (704 of FIG. 7), respectively. In some embodiments, the source and drain contacts 116, 110 may be formed by depositing a conductive layer over the source/drain mask (702 of FIG. 7) to fill the source and drain cavities (706, 704 of FIG. 7), performing a planarization process (e.g., chemical mechanical planarization) such that the conductive layer is co-planar with the source/drain mask (702 of FIG. 7), and then removing the source/drain mask (702 of FIG. 7), such that the remaining conductive layer defines the source contact 116 and the drain contact 110. Thus, in some embodiments, the source contact 116 comprises a same material as the drain contact 110. For example, in some embodiments, the source contact 116 and the drain contact 110 may comprise titanium or aluminum. In some embodiments, the material of the source contact 116 and the drain contact 110 has a work function that is less than the work function of the active layer 108 such that the source and drain contacts 116, 110 act as Ohmic contacts with the active layer 108. Further, in some embodiments, the formation of the source and drain contacts 116, 110 may include a heating process to promote the material of the source and drain contacts 116, 110 to diffuse into the active layer 108 and increase the Ohmic behavior of the source and drain contacts 116, 110. In some embodiments, the source contact 116 has a top surface that is above a top surface of a region of the conformal passivation layer 602 that contacts the source contact 116. Similarly, in some embodiments, the drain contact 110 has a top surface that is above a top surface of a region of the conformal passivation layer 602 that contacts the drain contact 110. In some embodiments, the top surfaces of the source contact 116 and the drain contact 110 may be substantially co-planar due to the planarization process.

Figure 9A:
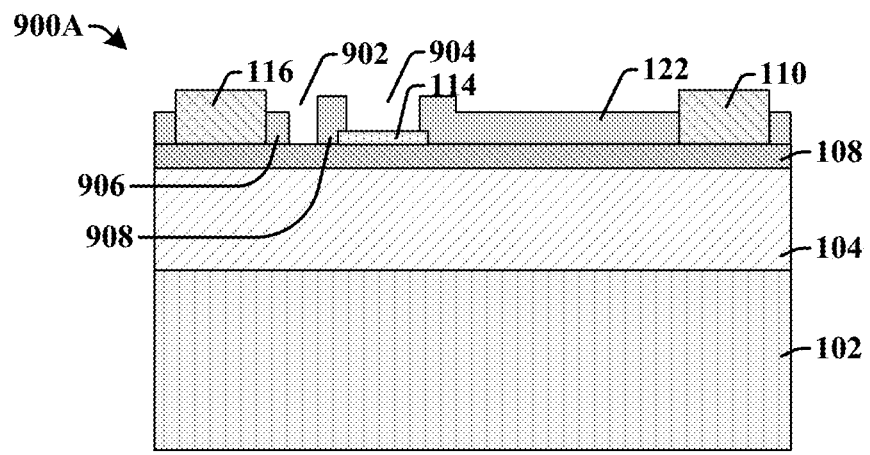

As shown in the cross-sectional view 900A of FIG. 9A, a first patterning step is performed to remove portions of the conformal passivation layer (602 of FIG. 8) to define a cap cavity 902 and a gate cavity 904. The first patterning step may be performed by depositing a photoresist, patterning the photoresist using a mask structure and photolithography, performing an etch according to the patterned photoresist, and removing the patterned photoresist. The mask structure is designed such that the patterned photoresist acts as a mask to define the cap cavity 902 and the gate cavity 904 in the passivation layer 122. In some embodiments, a first portion 906 of the passivation layer 122 separates the cap cavity 902 from the source contact 116, and a second portion 908 of the passivation layer 122 separates the cap cavity 902 from the gate cavity 904. In some embodiments, the gate cavity 904 has a width that is less than the width of the gate barrier layer 114. In other embodiments, the gate cavity 904 may be substantially aligned with outermost sidewalls of the gate barrier layer 114.

Figure 9B:
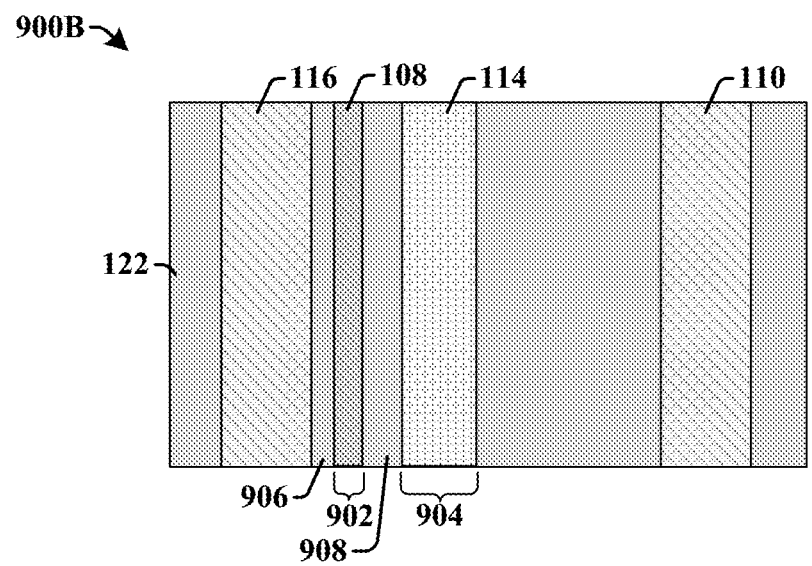

The top-view 900B in FIG. 9B corresponds to some embodiments of the cross-sectional view 900A of FIG. 9A. As shown in the top-view 900B, in some embodiments, the cap cavity 902 is spaced from the source contact 116 along a first direction, wherein the first direction is parallel to a top surface of the substrate (102 of FIG. 3). The cap cavity 902 exposes the active layer 108, and the gate cavity 904 exposes the gate barrier layer 114. In some embodiments, the cap cavity 902 continuously extends along a length of the source contact 116, wherein the length of the source contact 116 is measured in a second direction that is perpendicular to the first direction and parallel to the top surface of the substrate (102 of FIG. 3). In some embodiments, the gate cavity 904 is arranged closer to the source contact 116 than to the drain contact 110.

Figure 9C:
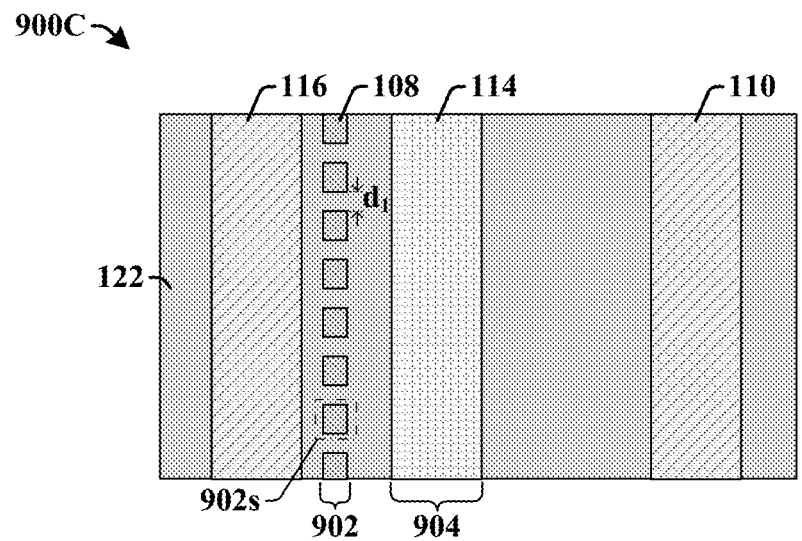

The top-view 900C in FIG. 9C corresponds to some embodiments of the top-view 900B of FIG. 9B. As shown in the top-view 900C, in some embodiments, the cap cavity 902 comprises multiple cap cavity segments 902s. Each cap cavity segment 902s is spaced apart from a nearest neighbor by a first distance di in the first direction and is spaced apart from the source contact 116 in the second direction. The cap cavity segments 902s are substantially aligned to one another along the first direction. Compared to the cap cavity 902 in FIG. 9C comprising multiple cap cavity segments 902s, the cap cavity 902 in FIG. 9B that continuously extends along the length of the source contact 116 may be formed with a simpler mask structure.

Figure 10:
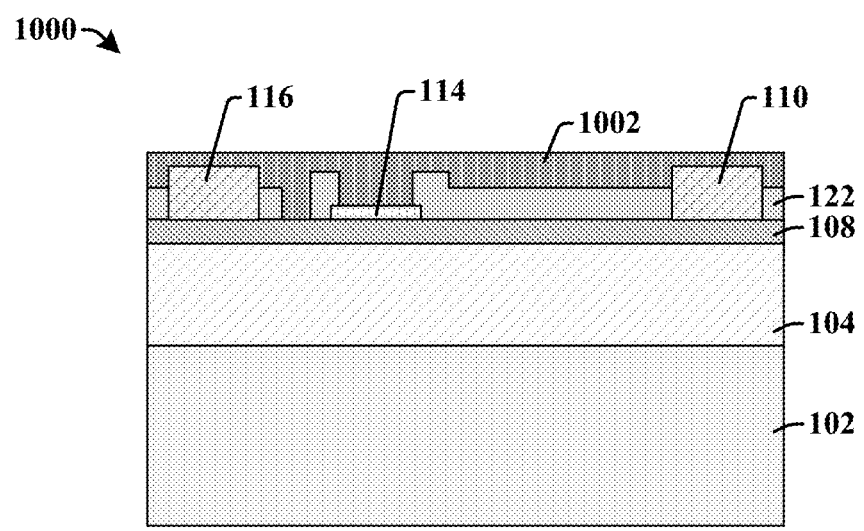

As shown in the cross-sectional view 1000 of FIG. 10, a masking layer 1002 is deposited over the passivation layer 122 and within the cap cavity (902 of FIG. 9A) and the gate cavity (904 of FIG. 9A). In some embodiments, the masking layer 1002 may comprise a photosensitive material (e.g., photoresist) formed by a spin coating process.

Figure 11:
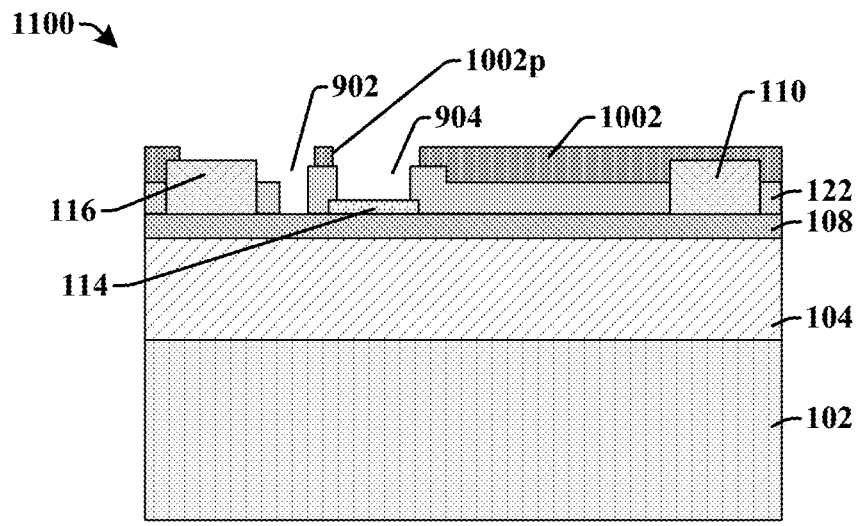

As shown in the cross-sectional view 1100 of FIG. 11, the masking layer 1002 is patterned to re-open the cap cavity 902 and the gate cavity 904. In some embodiments, where the masking layer 1002 comprises a photosensitive material, the layer of photosensitive material is selectively exposed to electromagnetic radiation according to a photomask. The electromagnetic radiation modifies a solubility of exposed regions within the photosensitive material to define soluble regions. The masking layer 1002 (e.g., the photosensitive material) is subsequently developed to define the cap cavity 902 and the gate cavity 904 by removing the soluble regions. In some embodiments, the masking layer 1002 is patterned such that a portion 1002p of the masking layer 1002 remains between the cap cavity 902 and the gate cavity 904.

Figure 12:
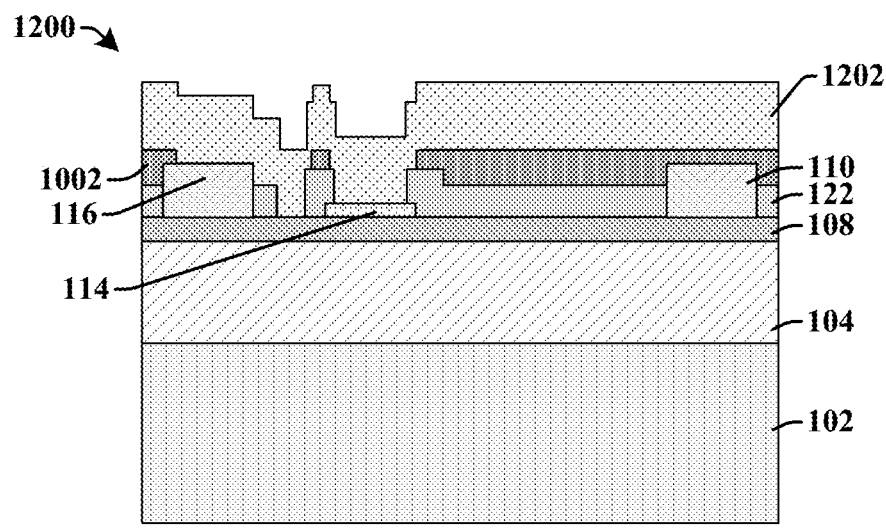

As shown in the cross-sectional view 1200 of FIG. 12, a gate electrode material 1202 is deposited over the masking layer 1002 and within the cap cavity (902 of FIG. 11) and the gate cavity (904 of FIG. 11). The gate electrode material 1202 may comprise, in some embodiments, titanium nitride. In other embodiments, the gate electrode material 1202 may comprise other conductive materials, such as, for example, nickel, tungsten, titanium, or platinum. The gate electrode material 1202 comprises a different material than the source and drain contacts 116, 110.

Figure 13:
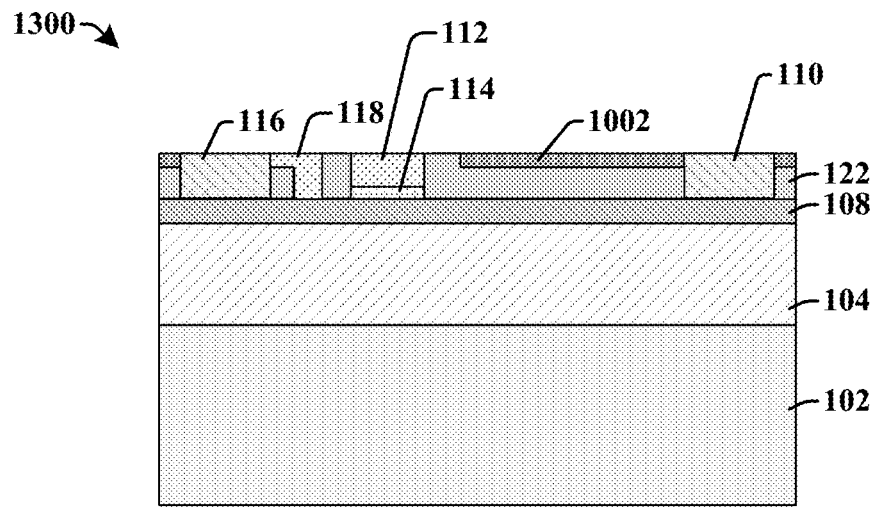

As shown in the cross-sectional view 1300 of FIG. 13, in some embodiments, the gate electrode material 1202 of FIG. 12 may undergo a planarization process (e.g., chemical mechanical planarization process), to form a cap structure 118 within the cap cavity (902 of FIG. 11) and a gate electrode 112 within the gate cavity (904 of FIG. 11). In some embodiments, the cap structure 118, the gate electrode 112, the source contact 116 and the drain contact 110 have top surfaces that are substantially co-planar because of the planarization process. In some embodiments, the planarization process is conducted until the passivation layer 122 is exposed, and thus, the masking layer 1002 may still remain on portions of the passivation layer 122.

Figure 14:
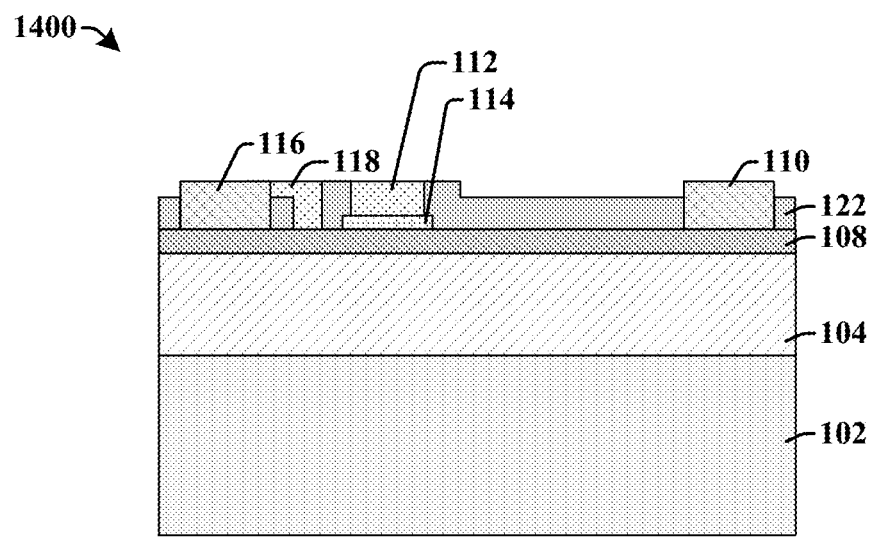

As shown in the cross-sectional view 1400 of FIG. 14, the masking layer (1002 of FIG. 13) is removed. In some embodiments, the masking layer (1002 of FIG. 13) is removed by an etch (e.g., wet or dry) that is selective to the material of the masking layer (1002 of FIG. 13). Together, the steps in FIGS. 13-14 to form the cap structure 118 and the gate electrode 112 may be defined as a second patterning step.

In some embodiments, the cap structure 118 comprises a material (e.g., the gate electrode material 1202 of FIG. 12) that has a higher work function than the active layer 108. Thus, the cap structure 118 acts as a Schottky contact with the active layer 108. In some embodiments, the cap structure 118 directly contacts the active layer 108 and the cap structure 118 does not diffuse into the active layer 108. Thus, in some embodiments, the cap structure 118 comprises a first material and acts as a Schottky contact with the active layer 108, whereas the source contact 116 comprises a second material that is different than the first material and acts as an Ohmic contact with the active layer 108. Therefore, in some embodiments, cap structure 118, as a Schottky contact, may increase the resistance in the heterojunction (124 of FIG. 1A) and may thereby reduce the saturation current of the HEMT device.

Figure 15:
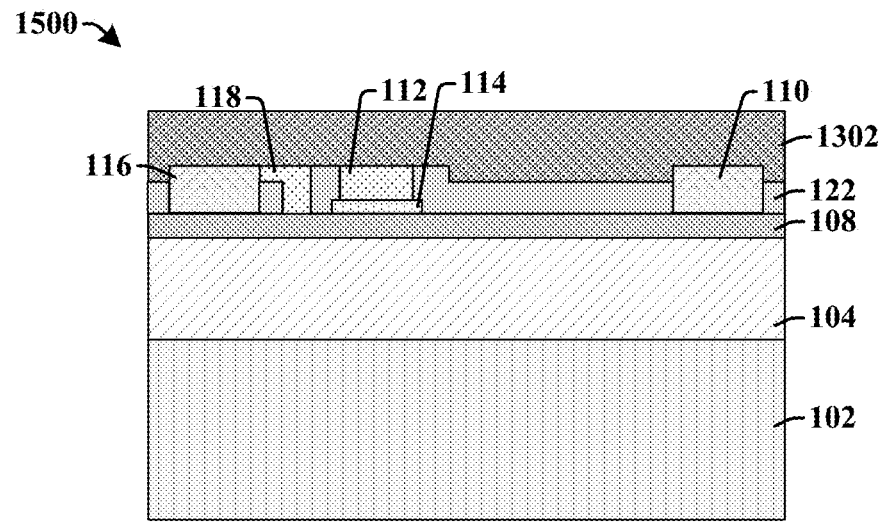

As shown in the cross-sectional view 1500 of FIG. 15, a dielectric material 1302 is deposited over the passivation layer 122. In some embodiments, the dielectric material 1302 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Thus, in some embodiments, the passivation layer 122 and the dielectric material 1302 may comprise a same material. In other embodiments, the passivation layer 122 and the dielectric material 1302 may comprise different materials.

Figure 16:
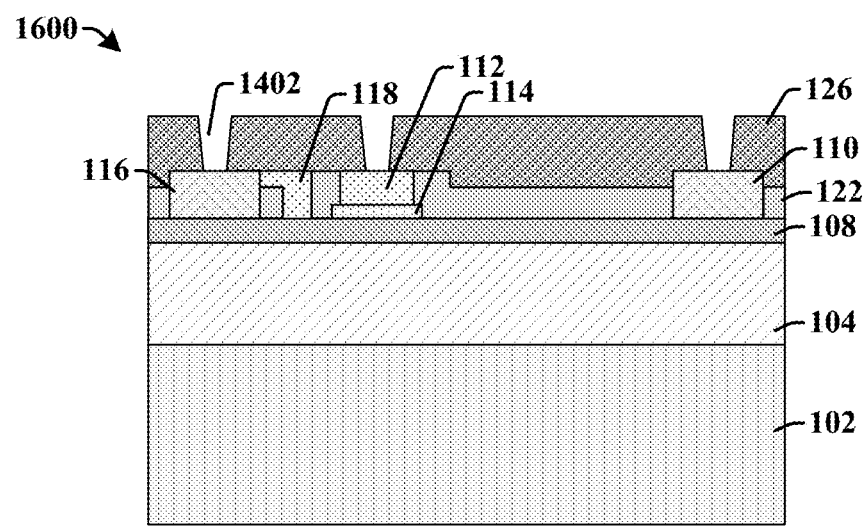

As shown in the cross-sectional view 1600 of FIG. 16, the dielectric material 1302 of FIG. 15 is patterned to form a dielectric structure 126 that defines contact cavities 1402. The dielectric structure 126 may be patterned using photolithography and an etch. The contact cavities 1402 down from a top surface of the dielectric structure 126 to expose the source contact 116, the drain contact 110, and the gate electrode 112.

Figure 17:
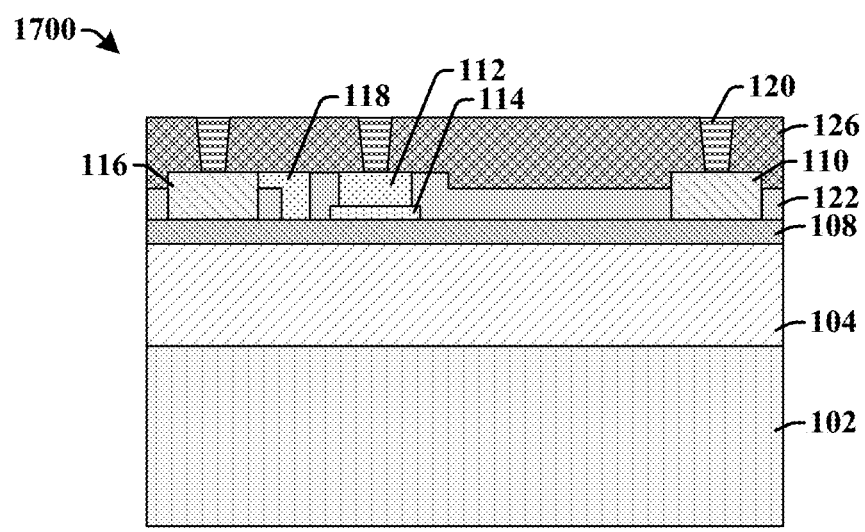

As shown in the cross-sectional view 1700 of FIG. 17, contact vias 120 are formed within the contact cavities 1402 of FIG. 16. In some embodiments, the contact vias 120 may be formed by depositing a conductive material over the dielectric structure 126 and performing a planarization process (e.g., a chemical mechanical planarization process) such that the contact vias 120 have top surfaces that are substantially co-planar with a top surface of the dielectric structure 126. In some embodiments, the conductive material of the contact vias 120 may comprise, for example, copper or tungsten.

Figure 18:
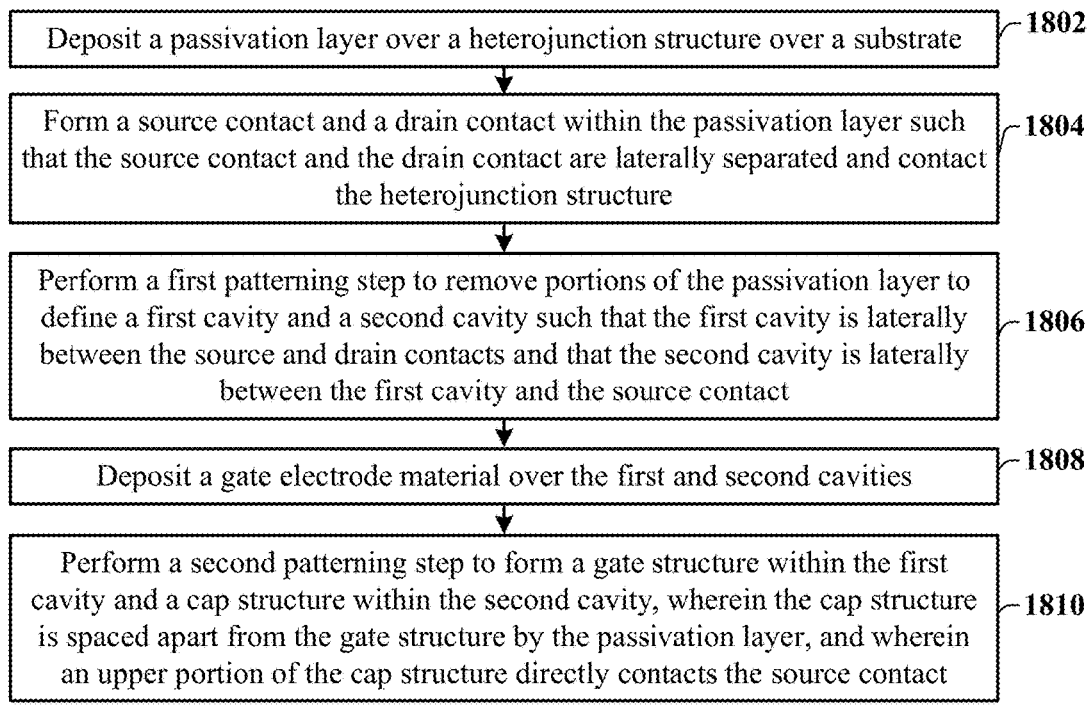
FIG. 18 illustrates a flow diagram of the method illustrated in FIGS. 3-17.

FIG. 18 illustrates a flow diagram of a method 1800 of some embodiments of forming a HEMT device with a cap structure contacting a source contact, thereby corresponding to FIGS. 3-17.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a passivation layer is deposited over a heterojunction structure that is over a substrate. FIG. 6 illustrates a cross-sectional view 600 of some embodiments corresponding to act 1802.

At 1804, a source contact and a drain contact are formed within the passivation layer such that the source and drain contacts are laterally separated and contact the heterojunction structure. FIGS. 7 and 8 illustrate cross-sectional views 700 and 800, respectively, of some embodiments corresponding to act 1804.

At 1806, a first patterning step is performed to remove portions of the passivation layer to define a first cavity and a second cavity. The first cavity is laterally between the source and drain contacts, and the second cavity is laterally between the first cavity and the source contact. FIG. 9A illustrates a cross-sectional view 900A and FIGS. 9B and 9C illustrate a top-views 900B and 900C, respectively, of some embodiments corresponding to act 1806.

At 1808, a gate electrode material is deposited over the first and second cavities. FIG. 12 illustrates a cross-sectional view 1200 of some embodiments corresponding to act 1808.

At 1810, a second patterning step is performed to form a gate structure within the first cavity and a cap structure within the second cavity. The cap structure is spaced apart from the gate structure by the passivation layer, and an upper portion of the cap structure directly contacts the source contact. FIGS. 13 and 14 illustrate cross-sectional views 1300 and 1400, respectively, of some embodiments corresponding to act 1810.

Therefore, the present disclosure relates to a method of manufacturing a HEMT device and a corresponding structure of a HEMT device that comprises a cap structure contacting a source contact in order to decrease the saturation current and therefore increase reliability of the HEMT device during high power applications.

Accordingly, in some embodiments, the present disclosure relates to a high voltage device, comprising: a substrate comprising a first semiconductor material; a channel layer comprising a second semiconductor material over the substrate; an active layer comprising a third semiconductor material over the channel layer; a source contact and a drain contact over the active layer and laterally spaced apart from one another; a gate structure laterally between the source contact and the drain contact and arranged over the active layer to define a high electron mobility transistor (HEMT) device, the gate structure comprising a gate electrode; and a cap structure coupled to the source contact and arranged between the gate structure and the source contact, wherein the cap structure is laterally spaced from the gate structure, and wherein the cap structure and the gate electrode comprise the same material.

In other embodiments, the present disclosure relates to a high electron mobility transistor (HEMT) device, comprising: a heterojunction structure arranged over a semiconductor substrate, the heterojunction structure comprising: a binary III/V semiconductor layer to act as a channel layer of the HEMT device, and a ternary III/V semiconductor layer arranged over the binary III/V semiconductor layer to act as an active layer; source and drain regions arranged over the heterojunction structure and spaced apart from one another in a first direction, wherein the first direction is parallel to an upper surface of the semiconductor substrate; a gate structure arranged over the heterojunction structure and arranged between the source and drain regions, wherein the gate structure comprises a gate electrode that comprises a first material; and a cap structure arranged over the heterojunction structure and directly contacting the source region and the ternary III/V semiconductor layer, wherein the cap structure is arranged between the source region and the gate structure in the first direction, wherein the cap structure is spaced from the gate structure, and wherein the cap structure comprises the first material.

In yet other embodiments, the present disclosure relates to a method of forming high electron mobility transistor (HEMT) device, comprising: depositing a passivation layer over a heterojunction structure over a substrate; forming a source contact and a drain contact within the passivation layer, wherein the source contact and the drain contact are laterally separated from one another and contact the heterojunction structure; performing a first patterning step to remove portions of the passivation layer to define a first cavity and a second cavity in the passivation layer, wherein the first cavity is laterally between the source contact and the drain contact, and wherein the second cavity is laterally between the first cavity and the source contact, and wherein the second cavity is laterally spaced apart from the source contact and the first cavity by the passivation layer; depositing a gate electrode material over the passivation layer and in the first cavity and the second cavity; and performing a second patterning step to form a gate structure within the first cavity and a cap structure within the second cavity from the gate electrode material, wherein the cap structure is spaced apart from the gate structure by the passivation layer, and wherein an upper portion of the cap structure directly contacts a sidewall of the source contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high voltage device, comprising:
   a substrate comprising a first semiconductor material;
   a channel layer comprising a second semiconductor material over the substrate;
   an active layer comprising a third semiconductor material over the channel layer;
   a source contact and a drain contact over the active layer and laterally spaced apart from one another;
   a gate structure laterally between the source contact and the drain contact and arranged over the active layer to define a high electron mobility transistor (HEMT) device, the gate structure comprising a gate electrode; and
   a cap structure coupled to the source contact and arranged between the gate structure and the source contact, wherein the cap structure is laterally spaced from the gate structure, wherein the cap structure and the gate electrode comprise the same material, wherein an upper portion of the cap structure directly contacts an upper sidewall of the source contact, and wherein a bottom portion of the cap structure is laterally spaced from a lower sidewall of the source contact.

2. The high voltage device of claim 1, wherein the cap structure comprises a different material than the source contact.

3. The high voltage device of claim 1, wherein the cap structure continuously extends along a length of the source contact.

4. The high voltage device of claim 1, wherein the cap structure is "L-shaped" from a cross-sectional view.

5. The high voltage device of claim 1, wherein the cap structure comprises a first bottom surface above a second bottom surface, wherein the first bottom surface is spaced apart from the active layer, and wherein the second bottom surface directly contacts the active layer.

6. The high voltage device of claim 1, wherein the cap structure is conductive and electrically coupled to the source contact.

7. A high electron mobility transistor (HEMT) device, comprising:
- a heterojunction structure arranged over a semiconductor substrate, the heterojunction structure comprising: a binary III/V semiconductor layer to act as a channel layer of the HEMT device, and a ternary III/V semiconductor layer arranged over the binary III/V semiconductor layer to act as an active layer;
- source and drain regions arranged over the heterojunction structure and spaced apart from one another in a first direction, wherein the first direction is parallel to an upper surface of the semiconductor substrate;
- a gate structure arranged over the heterojunction structure and arranged between the source and drain regions, wherein the gate structure comprises a gate electrode that comprises a first material; and
- a cap structure arranged over the heterojunction structure and directly contacting the source region and the ternary III/V semiconductor layer, wherein the cap structure is arranged between the source region and the gate structure in the first direction, wherein the cap structure is spaced from the gate structure, wherein the cap structure comprises the first material, and wherein the cap structure comprises a horizontally extending portion that directly contacts a sidewall of an upper portion of the source region and a vertically extending portion that is spaced apart from the source region, wherein the vertically extending portion has an upper region that contacts the horizontally extending portion and a lower surface that directly contacts the ternary III/V semiconductor layer.

8. The HEMT device of claim 7, wherein the source and drain regions comprise a second material that is different from the first material, and wherein the first material has a work function that is greater than a work function of the second material.

9. The HEMT device of claim 7, wherein the gate structure is arranged closer to the source region than the drain region.

10. The HEMT device of claim 7, wherein the cap structure continuously extends along the source region in a second direction, wherein the second direction is perpendicular to the first direction.

11. The HEMT device of claim 7, wherein the source and drain regions comprise a second material that has a work function less than a work function of a material of the active layer, and wherein the first material has a work function greater than the work function of the material of the active layer.

12. The HEMT device of claim 7, further comprising:
- a passivation layer arranged between the vertically extending portion and the source region in the first direction, wherein the horizontally extending portion is arranged directly over the passivation layer.

13. A high voltage device, comprising:
- a substrate comprising a first semiconductor material;
- a channel layer comprising a second semiconductor material over the substrate;
- an active layer comprising a third semiconductor material over the channel layer;
- a source contact and a drain contact over the active layer and laterally spaced apart from one another;
- a gate structure laterally between the source contact and the drain contact and arranged over the active layer to define a high electron mobility transistor (HEMT) device, the gate structure comprising a gate electrode arranged over a gate barrier layer; and
- a cap structure electrically coupled to the source contact, arranged between the gate structure and the source contact, and comprising a material that has a higher work function than a work function of the third semiconductor material, wherein a topmost surface of the cap structure is substantially coplanar with a topmost surface of the source contact.

14. The high voltage device of claim 13, wherein the source contact comprises a material that has a lower work function than the work function of the third semiconductor material.

15. The high voltage device of claim 13, wherein the cap structure comprises a horizontally extending portion and a vertically extending portion, wherein the horizontally extending portion directly contacts the source contact and is spaced apart from the active layer, and wherein the vertically extending portion directly contacts the horizontally extending portion and the active layer.

16. The high voltage device of claim 13, wherein the cap structure and the gate electrode comprise a same material.

17. The high voltage device of claim 13, further comprising:
- a contact via arranged over and directly contacting an upper surface of the source contact, wherein the contact via is electrically coupled to the source contact and the cap structure.

18. The high voltage device of claim 1, wherein the cap structure is coupled to the active layer as a Schottky contact.

19. The HEMT device of claim 7, wherein the cap structure is coupled to the active layer as a Schottky contact, and wherein the source region is coupled to the active layer as an Ohmic contact.

20. The high voltage device of claim 13, wherein an upper portion of the cap structure directly contacts an upper sidewall of the source contact, and wherein a bottom portion of the cap structure is laterally spaced from a lower sidewall of the source contact.

* * * * *